United States Patent
Bosak et al.

[11] Patent Number: 6,043,657
[45] Date of Patent: Mar. 28, 2000

[54] CALIBRATION OF RF PULSES FOR MRI

[75] Inventors: Elyakim Bosak, Moshav Kerem Maharal, Israel; Joseph Schiff, San Antonio, Tex.

[73] Assignee: General Electric Company, Waukesha, Wis.

[21] Appl. No.: 08/933,101

[22] Filed: Sep. 18, 1997

[51] Int. Cl.⁷ .................................................... G01V 3/00
[52] U.S. Cl. .......................... 324/313; 324/309; 324/314; 324/307
[58] Field of Search .............................. 324/313, 300–322

[56] References Cited

U.S. PATENT DOCUMENTS

| | | | |
|---|---|---|---|
| 4,443,760 | 4/1984 | Edelstein et al. | 324/309 |
| 4,814,708 | 3/1989 | Van Der Meulen et al. | 324/309 |
| 4,866,386 | 9/1989 | Sattin et al. | 324/314 |
| 4,885,542 | 12/1989 | Yao et al. | 324/313 |
| 4,983,921 | 1/1991 | Kramer et al. | 324/309 |
| 5,260,654 | 11/1993 | Cory | 324/309 |

OTHER PUBLICATIONS

Stewart C. Bushong "Magnetic Resonance Imaging Physical and Biological Principles" Second Edition Textbook Chapters 3,5,16 pp. 46–47, 68–69, 224–225 ISBN 0–8151–1342–0, 1996.

James Stewart "Calculus" Second Edition Textbook.Chapter 3 pp. 178–201 ISBN 0–534–13212–X, 1991.

Primary Examiner—Christine K. Oda
Assistant Examiner—Tiffany A. Fetzner
Attorney, Agent, or Firm—Fenster & Company Patent Attorneys, Ltd.

[57] ABSTRACT

Determining the magnitude of the calibration RF pulse using the signal phase rather than the signal amplitude.

24 Claims, 2 Drawing Sheets

CALIBRATION OF RF PULSES FOR MRI

FIELD OF THE INVENTION

This invention is concerned with magnetic resonance imaging systems and more particularly with the calibration of RF pulses used in such systems.

BACKGROUND OF THE INVENTION

In magnetic resonance imaging, part of the procedure is to apply radio frequency pulses to resonating nuclei to obtain selected tip angles. The tip angles most commonly used are a 90° angle and a 180° angle. Low tip angles such as between 5°–90° are also routinely used. If the radio frequency pulses produce a tip angle which differs enough from a selected tip angle, the difference or error will cause degradation in the result of the magnetic resonance procedure; i.e. reduced signal to noise ratio in the images.

In magnetic resonance imaging each patient loads the system differently and therefore the energy of an RF pulse which excites an RF coil to produce a selected tip angle of say 90° for example is changed per patient. Accordingly, the RF pulse has to be calibrated for each patient to determine how much RF power must be provided to produce a 90° tip angle. In the prior art, there are many patents disclosing methods and means for calibrating the tip angles. See for example, U.S. Pat. Nos. 4,983,921, 4,866,386 and 4,814,708.

In general, the art calibrates RF pulses by determining the magnitude of an RF pulse which provides maximum or minimum values of the signal amplitude. It used these measured magnitudes for calibrating the RF pulse required to provide a desired tip angle. Different RF pulses are used and the signal resulting from irradiation by the RF pulses measured. The magnitude of the RF pulse that results in the maximum signal is determined to be the RF pulse which gives a 90° tip angle. However, as is well known, the signal amplitude depends on the RF amplitude in a generally sinusoidal manner with relatively broad maximum and minimum areas. Accordingly accurate determination of the maxima and minima are difficult to obtain. The magnitude of an applied RF pulse, that is the area under the RF pulse, determines the tip or nutation angle.

The use of the signal amplitude to determine the tip angle is problematic for other reasons as well. Among other things, the signal amplitude is strongly dependent on T1 and T2 decay time characteristics of the subject being examined and is sensitive to motion of the subject, be it flow, respiration or body movement.

In general, the nutation of the spins in the patient to be imaged is typically provided by applying the RF pulse to an RF coil that is closely coupled to the patient. Thus, RF coil loading and hence the resulting RF amplitude depends on the position, size and other parameters of the patient. Therefore, it is typically necessary to recalibrate the RF pulse at least for each patient. Even if the patient (or coil) is moved the Q factor and loading of the coil changes, so that the amplitude of the RF energy to the coil must also be changed. This typically requires the RF pulse to be recalibrated. Each calibration takes valuable throughput time during which the patient is within the magnet and subject to the discomforts thereof and during which the device cannot be used for additional patients.

Thus, in order to increase patient throughput, to reduce the amount of time that the patient is in the magnet and to minimize the apprehension that some patients suffer from being within the magnet, it is important to perform the RF calibration as rapidly as possible.

In addition to being inaccurate, the prior art systems are generally time consuming because many iterations are required to determine the RF pulse magnitude based on the maximum tipped signal.

In order for the magnetization to recover following an excitation and before the next suppression pulse, the time-to-repeat (TR) should exceed T1. The iterations with the long TRs cause the calibration time to be long. Accordingly, a calibration system is required which is basically independent of the relaxation times, is relatively insensitive to motion and wherein calibration of the RF pulse can be performed within time periods in the order of seconds.

SUMMARY OF THE PRESENT INVENTION

In accordance with an aspect of the present invention, a system of calibrating RF pulses is provided. In a preferred embodiment of the invention, the determination of an RF pulse which provides the desired tipping of the magnetization is determined directly. Preferably, this determination is made based on a measurement of the phase of a signal resulting from the excitation rather than on the amplitude of the signal. While, as indicated above, the amplitude of the signal has rather broad maxima and minima, the present inventors have determined that it is possible to determine the RF amplitude required to provide a desired tip angle from the phase, and in particular from a sharp transition in the phase, of the resulting signal.

This discovery is based on the realization that following an RF pulse of less than 90° applied to spins aligned in the Z direction in a subject, there is a magnetic moment in the +Z direction. When an RF pulse of more than 90° is applied the Z directed magnetic moment is in the −Z direction. In a preferred embodiment of the invention, it is the sign of the Z directed moment which is used to determine if the RF pulse results in a tip angle that is greater than or less than 90°.

In a preferred embodiment of the invention, the phase of a signal resulting from the Z-component component of the magnetization is measured. The present inventors have found that the phase of such a signal is especially useful in determining whether the RF pulse is larger than or smaller than a 90° pulse, since the phase of this signal varies sharply between the two conditions. In particular, the inventors have found that, if the signals from the X and Y components of the magnetization are suppressed, then a signal from an excited residual Z magnetization changes phase by 180° as the RF power is varied from below to above the 90° point. In general, the phase of the signal is herein defined as +90° while the tip angle is below 90° and as −90° while the tip angle is above 90°. Of course the phases of the signal could be defined in an opposite manner.

Thus, in an especially preferred embodiment of the invention, a body is irradiated with an RF pulse which causes tipping of the spins. A spoiler gradient is then applied to spoil the magnetization in the X-Y plane. A further RF pulse is applied to excite the residual Z magnetization and the phase of the signal resulting from the residual Z component of the spins is determined. The sign of this phase is determined. Optionally any number of further RF pulses are applied and the RF pulse which results in a signal having a phase closest to the phase transition (+ to − or − to +) is determined to be of the magnitude necessary for a 90° pulse. The magnitude of RF pulses required for other tip angles can be determined from the 90° pulse by the well known proportional relationship between the RF pulse energy and the tip angle.

In order to provide as sharp a transition as possible, in an especially preferred embodiment of the invention, signals resulting from the X and Y components of the magnetization are suppressed. In various preferred embodiments of the invention the signal to be measured is induced by an RF pulse or pulses and the phase of the signal is determined.

In summary, the preferred method uses the phase of the sampled signal for calibration purposes rather than utilizing its amplitude. More particularly, the preferred embodiment of the present invention uses the change of sign (+ to − or − to +) of the Z component of the spins after the aligned spins are tipped by a certain angle for calibration purposes. The application of an RF pulse to the aligned spins, tips or nutates the spins. The calibration described herein determines the magnitude of the RF pulse required to tip the aligned spins by 90°. It is known that a 90° RF pulse, tips the spins into the X-Y plane of an XYZ orthogonal coordinate system. If the magnitude of the RF pulse is less than ideal a small component of the aligned spins remains on the positive portion of the Z axis or more precisely in the positive Z direction. If the RF pulse magnitude is greater than the ideal, a small component of the aligned spins are tipped into the negative portion of the Z axis. Preferably, the RF pulse that provides a 90° tip angle is determined by the phase change from positive to negative value of the component of the aligned spins remaining along or parallel to the Z axis.

Once the magnitude of the RF pulse needed to tip the aligned spins 90° is determined, the magnitude of the RF pulses needed to tip the aligned spins other amounts such as 180° or 20° is determined using multiples or fractions of the 90° RF pulse magnitude.

Furthermore, since the phase rather than the magnitude is being measured, it is not necessary to wait between pulses for the effects of the previous excitation to decay completely. All that is necessary is to wait for the Z directed magnetization to recover sufficiently such that the Z magnetization is positive prior to the next RF pulse. Since the amplitude of the resulting signal is not important, the complete decay, which affects amplitude is not important.

In accordance with a preferred embodiment of the invention, a method of calibrating a 90° RF pulse is provided. The method comprises: placing a patient in a large static magnetic field; applying an RF pulse to be calibrated, such as a suppression pulse, to the patient. The applied suppression pulse preferably should be of substantially less than sufficient power to tip the spins 90°; then some of the aligned spins are tipped into the X-Y plane and a component remains in the +Z direction. Subsequently, a gradient spoiler pulse is preferably applied in the encoding direction. This pulse spoils or destroys the magnetization in the X-Y plane leaving only the magnetization that remained along the Z direction. Preferably, a spin echo (SE) sequence is then applied. The SE sequence comprises two RF pulses with the magnitudes that tip the spins by $\alpha$ and $2\alpha$; respectively, where $\alpha$ is approximately a 90° rotation. Prior to the calibration, $\alpha$ is, of course, only roughly determined. Two spoilers, one on each side of the $2\alpha$ pulse, generate a decay to the signal of fast moving spins. Slice selecting gradient pulses are applied during the application of the excitation pulses. The slice selecting gradient of the SE 90° pulse is preferably followed by a refocusing gradient pulse. This series of pulses moves a part of the component of magnetization from the Z axis to the X-Y plane. If the Z component of the magnetization was positive, i.e. if the RF suppression pulse moved the spins less than 90°, the Z component will be moved to the positive portion of an axis that is defined as the Y axis. If the RF pulse tipped the spins more than 90°, the component will be tipped into the negative portion of the Y axis.

A spin echo (SE) signal is then detected. Use of a sampling or viewing gradient is optional. The SE signal is measured in any well known manner to determine its phase angle.

In a next series of steps the magnitude of the RF pulse is changed, preferably increased until it causes the Z component of the magnetization to be opposite from that in the first measurement. In general, it is easier to start with an RF pulse which is known to be too small to cause a 90° tip, so that an indication of the phase of the signal resulting from the tip that is less than 90° can be easily determined. The RF amplitude is then increased until the 180° phase jump is surpassed. Preferably the RF pulses are increased geometrically.

Once the tip angle produced by an applied RF pulse is determined to be above 90°, i.e., after the 180° phase shift in the signal, positive to negative or vice versa, a refined or more exact determination of the RF power necessary to produce a 90° tip angle may be used.

The refined determination is accomplished in a preferred embodiment, for example, by closing in on the 90° RF pulse from both sides, step by step. This is done by determining a first mid-point between the power of the last suppression pulse used to provide a signal that did not exhibit a 180° phase jump and the power of the RF pulse that resulted in a 180° phase shift jump. If this first mid-point power RF suppression pulse causes a 180° phase shift, then it is known that the RF power necessary to cause the 180° phase shift is below the power of the first mid-point power RF suppression pulse. Consequently, the power of the second mid-point RF suppression pulse is between the power of the first mid-point RF suppression pulse and the power of the last used RF suppression pulse that did not result in a 180° phase jump in the SE signal.

If, on the other hand, the first mid-point power RF suppression pulse does not produce a 180° phase shift then the power of the next RF suppression-pulse is selected to be the mid-point between the power of the first mid-point RF suppression pulse and the power of the RF suppression pulse that first caused a 180° phase shift in the SE signal. This process is continued for determining a value of the power of the RF suppression pulse that is as close as deemed necessary to cause the 180° phase shift in the SE signal.

The values of the suppression pulses being calibrated are preferably a geometrical series, however any incremental values may be used within the scope of the invention. If the phase has not changed by 180° then the procedure is continued. When the phase changes by 180°, the vernier procedure described is continued in order to refine the determination of the power required to cause a 180° phase shift in the acquired signal until the operator is satisfied that an accurate enough determination of the 90° phase shifting RF pulse magnitude has been found.

The advantages of this calibration system are multifaceted. The unique calibration system is relatively immune to flow or to motion and the accuracy of the calibration of the 90° pulse is improved. Further, the short time between the excitation pulses and the sampling decreases the system's sensitivity to motion. Furthermore the use of two spoilers on both sides of the SE 180° pulse destroys any fast inflow signal such as for example signals generated by inflowing blood.

Note also that the suppression pulse has wide spatial coverage while the excitation pulse has narrow spatial coverage. This insures that magnetization excited by the excitation pulse "feels" the suppression pulse. That is the spins acted on by the excitation pulse had historically been exposed to the suppression pulse and were tipped into the positive or negative portion of the X-Z plane. Consequently the signal phase is an excellent indicator of the tip angle produced by the RF suppression pulse.

In the steps utilized in determining the 90° pulse, care has to be taken to be sure that before applying every incremental change in the RF pulse, the magnetization has properly recovered and is directed along the equilibrium direction of the magnetization +Z. The time to repeat (TR) is shortened by assuring that the magnetization is at a steady state. This is accomplished by running some dummy cycles prior to the actual calibration run. That is prior to a measured calibration sequence, some cycles are run without any measurement of the signal. The run is to force the system into a steady state condition. The applicable TR's are in the order of 200 msec which enables the complete calibration to be accomplished in the matter of a few seconds.

A method of determining a magnitude of an RF pulse necessary to tip spins aligned, with a magnetic field in an object located in the magnetic field of a magnetic resonance system, said method including the steps of:

suppressing magnetization of all spins using RF pulses of progressively changing magnitudes except for residual ones of the spins, that are aligned with the magnetic field;

acquiring signals by exciting said residual spins with RF pulses; and determining the magnitude of the RF pulse that first causes a 180° phase shift in the acquired signals.

While the system described herein relates with particular reference to magnetic resonance imaging it is to be understood that the invention also has important applications in magnetic resonance spectroscopy.

BRIEF DESCRIPTION OF THE DRAWINGS

These as well as other objects and advantages of the present invention will be more completely understood and appreciated by carefully studying the following detailed description of a presently preferred exemplary embodiment of the invention in conjunction with the attached drawings, in which.

DESCRIPTION OF PREFERRED EMBODIMENTS OF THE INVENTION

Figure 1:
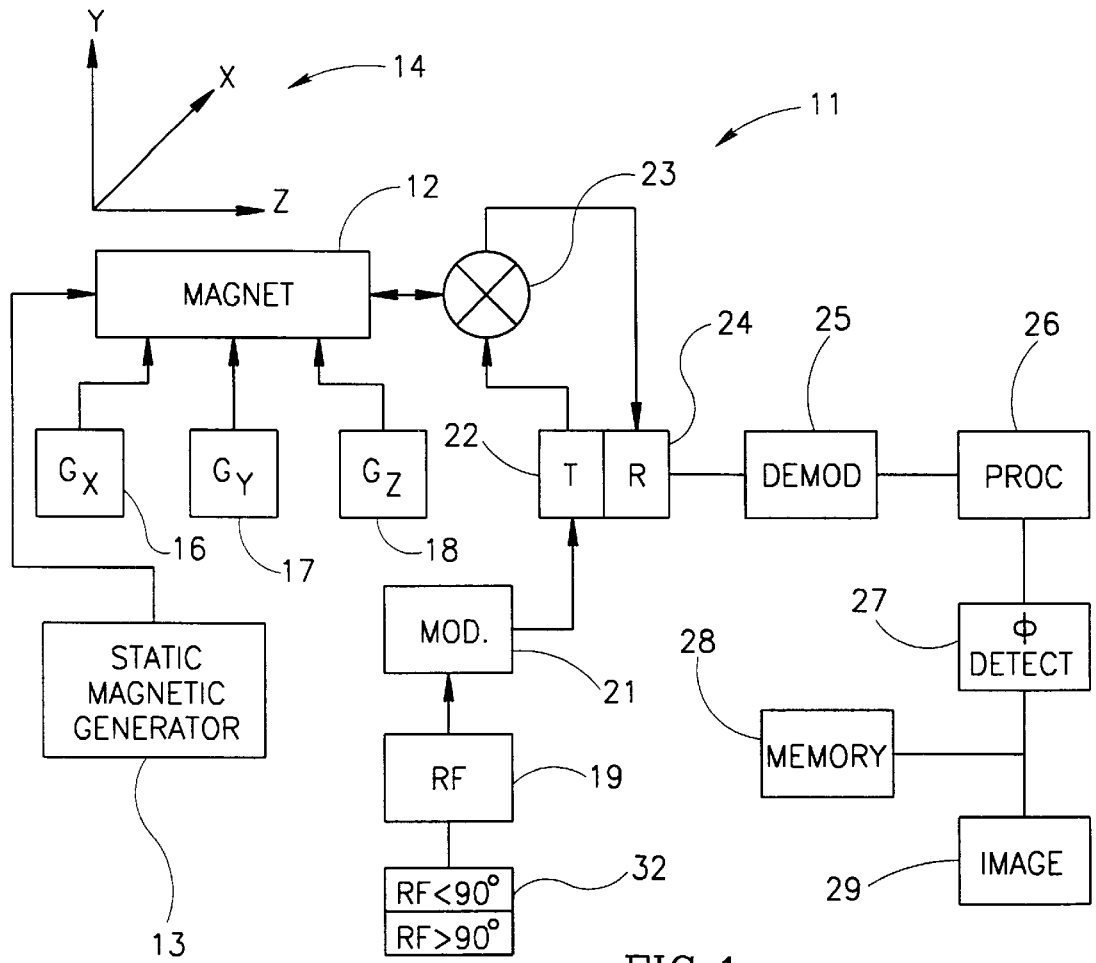
FIG. 1 is a block diagram of an MRI system for carrying out the present invention.

FIG. 1 is a general showing of a magnetic resonance imaging (MRI) system 11 incorporating the invention. More particularly, MRI system 11 includes a large magnet 12 capable of receiving a patient therein. The magnet 12 is energized to have a large static homogeneous magnetic field by magnetic generator Ho shown at 13. The large static magnetic field acts on the patient by causing the "spins" in the patient to align with the static magnetic field in the Z direction.

Gradients may be applied to the magnetic field in orthogonal X, Y and Z direction. Those directions are shown by the arrows at 14. The gradient generators for the X, Y, and Z direction are shown as the GX, GY and GZ generators 16, 17 and 18 respectively.

Radio frequency excitation pulses are used to excite the spins that are aligned with the large static magnetic field to generate image data. The RF pulses rotate the spins aligned in the Z direction to form vectors having a major component in the X-Y plane. However, preferably, the excitation of the initial RF pulses cause the spins to tip less than 90°. Then a component of the spins remains along the positive Z axis. When the RF pulse is of sufficient power to tip the spins more than 90°, then the major portion of the spins are tipped into the X-Y plane but a portion is left along the negative Z axis. The RF excitation following such a pulse generates a signal which is 180° out of phase as compared to another SE signal resulting from pulses that are below 90°. That is when the first signal is positive, then the second signal is negative, and vice versa.

The RF pulse generator is shown at 19. The output of the RF pulse generator provides a pulse that is modulated at modulator 21 and is transmitted through the transmitter 22 and a switching means 23 to an RF coil (not shown) within the magnet.

Responsive to the tipping of the aligned spins, a signal is generated. This signal is detected preferably by the same RF coil used for transmission. In some cases a separate RF coil is used. In either case, the signal is received through switch 23 at receiver 24 and demodulator 25. The demodulated received signal is processed in processor 26 to convert the received signal into imaging data.

The processing in the inventive MRI system includes determining the phase of the generated signal as indicated at 27. This phase determination can be done using many various well known methods. The processing of the received signal provides image data which may be stored in memory 28 and/or displayed on displaying means 29. The whole system is under the control of a central control processor (not shown for reasons of simplification). The control processor is, of course connected to, and controls the other components.

In practice, in accordance with a preferred aspect of the invention the RF pulses used for suppression are controlled so that initially as shown at block 32, an RF pulse that has insufficient power to provide a 90° tip of the aligned spins is used. An SE signal is acquired responsive to $\alpha$ and $2\alpha$ RF pulses and the phase of the acquired signal is determined. The next RF suppression pulse is made larger, for example 3 dB larger. Further suppression pulses, each preferably 3 dbs larger than the last pulse, are applied until the spins are tipped more than 90° in order to bracket the transition point. Then RF pulses are chosen to close in on the 90° RF suppression pulse. Each step takes somewhere between 100 and 200 milliseconds for suppression, spoiling, excitation, sampling and recovery of the magnetization.

Figure 3:
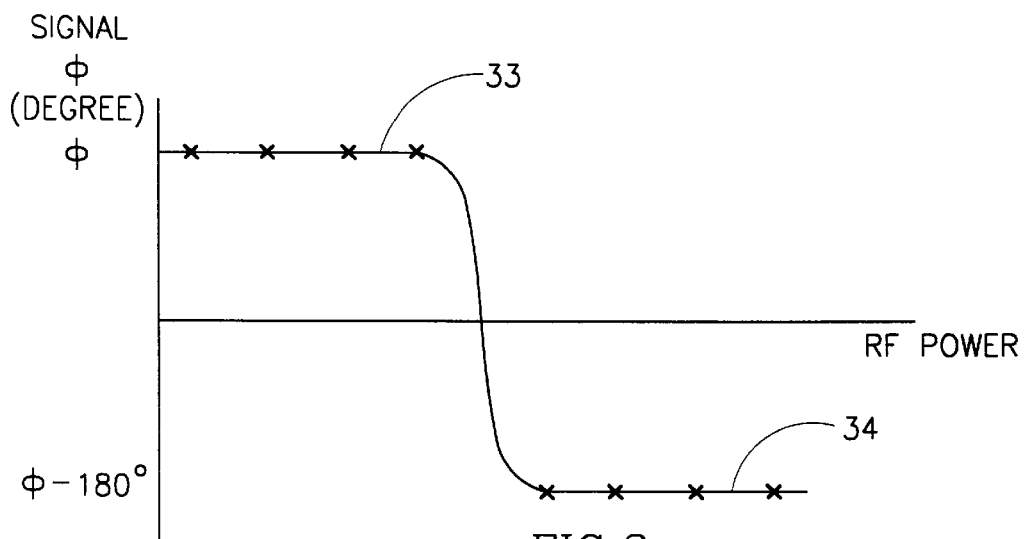
FIG. 3 is a graph showing the phase of the sampled signal obtained using the pulse sequence of FIG. 2, as a function of the RF power.

A phase response curve, i.e. signal phase versus RF pulse power is illustrated in FIG. 3. The figure illustrates that the phase of the signal initially remains constant during the application of the low power RF pulses as illustrated along the horizontal positive line 33. When the RF pulse power increases so that the tip angle is above 90°, then as shown in FIG. 3 the phase of the signal suddenly takes a large 180° step to the negative line 34. It is at the middle of the phase transition area that the 90° tip angle is obtained.

Figure 2:
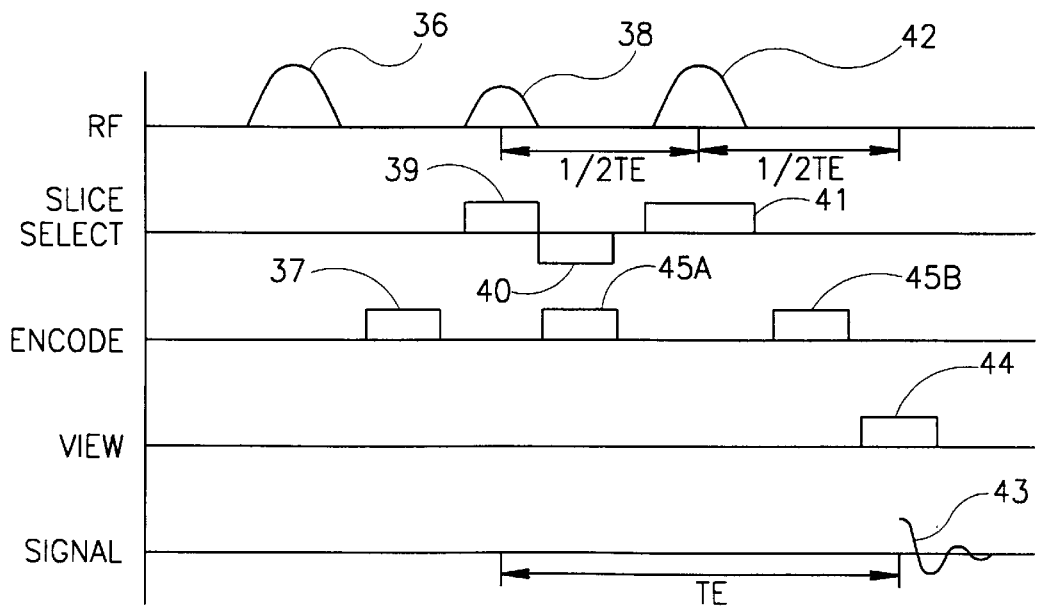
FIG. 2 shows an exemplary pulse sequence followed in carrying out the present invention.

FIG. 2 shows a sample pulse sequence for carrying out the invention. As shown in FIG. 2, an RF suppression pulse, shown at 36, is first applied. This pulse is initially preferably kept well under 90°. Following the suppression pulse 36 which is applied with or without a slice selecting gradient, a spoiler encoding gradient pulse 37 is applied. The spoiler pulse spoils magnetization in the X-Y plane.

An SE excitation sequence is then preferably used. A first RF pulse 38 of α° is applied during the application of a slice select gradient shown at 39. The slice select gradient 39 is shown as being followed by a refocusing gradient 40. After a time period TE/2, a second RF pulse 42 of 2α° is applied. A slice select gradient 41 may be applied during the application of the second RF pulse 42. After another time period of TE/2, a signal 43 is acquired. A sampling gradient 44 may be applied in the view direction (X) while the signal 43 is acquired. It is the signal 43 that is used to determine the phase of the signal. If the phase of the signal is positive, the RF pulse magnitude was insufficient to tip the spin more than 90°. Note that two spoiler gradients 45a and 45b on both sides of the 2α pulse 42 are applied in the preferred embodiment of the invention.

When the RF suppression pulse's magnitude, (i.e. the power of the pulse) is sufficient to tip the spins through 90°, the phase on the curve of FIG. 3 will shift by 180° from positive to negative. If the RF pulse magnitude does not tip the spins more then 90°, a new, more powerful, suppression pulse is applied. In a preferred embodiment, the new suppression pulse is 3 dB larger than the preceding suppression pulse. However, the new RF suppression pulse is not applied until the Z magnetization has returned to be positive Z magnetization. Preferably the system is in a steady state condition and hence the magnetization returns to its positive direction in a short period of time.

As mentioned before, in the prior art the calibration is done by comparing the signal amplitude acquired using RF pulses having different magnitudes (power). Basically the signal amplitude behaves according to:

Signal≈$M_z$ (t=o) * sin (tip angle)

Note that the signal amplitude is a function of the magnitude of the Z magnetization at time equal 0 as well as of the sin of the tip angle. This requires all the Z magnetization magnitudes prior to each cycle to be equal. Thus long TR's are required in the prior art to enable the Z magnetization to regain its original magnitude.

In contrast to the prior art the present invention determines the 90° RF pulse by the phase change. This only requires the Z magnetization to be positive at the beginning of each sequence.

Figure 4:
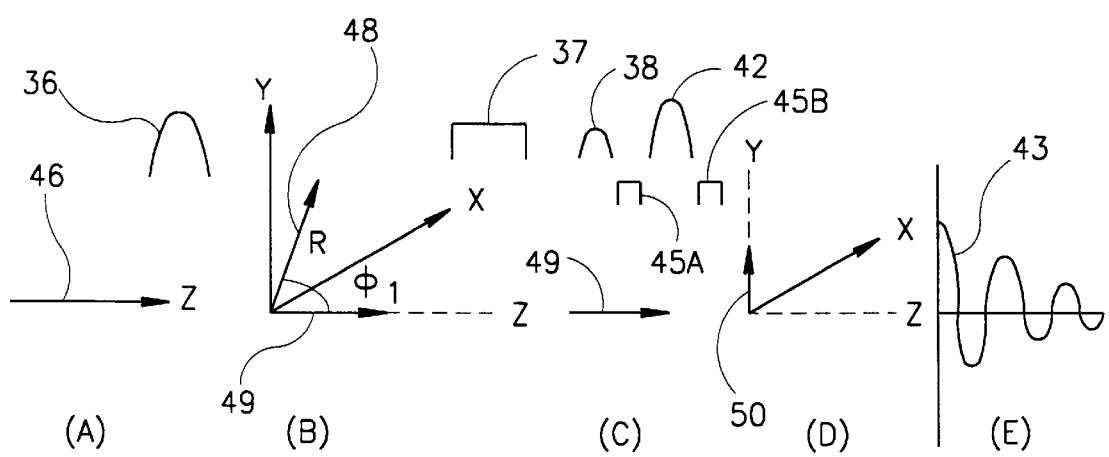
FIG. 4 is a vector diagram showing what occurs when the RF pulse being calibrated provides a tip angle of less then 90°.

FIG. 4 shows the tipping of the spins when the excitation pulse 36 is less than a 90° pulse. As shown in FIG. 4A, when the patient is within the magnet having a large static magnetic field in the Z direction the spins align in the Z direction as shown at 46. This alignment is assigned as being in the positive M direction. The first suppression pulse 36 that is not sufficient to tip the spins a full 90° is applied. The suppression pulse 36 causes the spins of 46 to tip to vector 48 at an angle Ø1 from the Z axis (FIG. 4B), with a major component in the X-Y plane and a smaller component 49 remaining along the Z axis. When the RF pulse tips the spins less than 90°, the components in the X-Y plane and Z axis are positive. When the RF pulse tips the spins more than 90°, the components in the X-Y plane and Z axis are negative. The spoiler pulse 37 in the Y direction spoils the component of the magnetization 48 in the X-Y plane. Thus, only the Z component of the magnetization 49, shown at FIG. 4C, remains. Next an SE excitation sequence; i.e., the α RF pulse 38 and the 2α RF pulse 42 with spoilers 45A, 45B are preferably applied. The result is that the spins have a positive component in the X-Y plane shown at 50 (FIG. 4D). The resulting SE signal 43 is then acquired (FIG. 4E).

The phase of the acquired signal is determined. The signal is comprised of real and imaginary parts. In a preferred embodiment of the invention, the phase of the signal is determined by taking the magnitudes of the real and imaginary parts of the acquired signal and determining the phase from the arctangent of the ratio between the real and imaginary parts.

Figure 5:
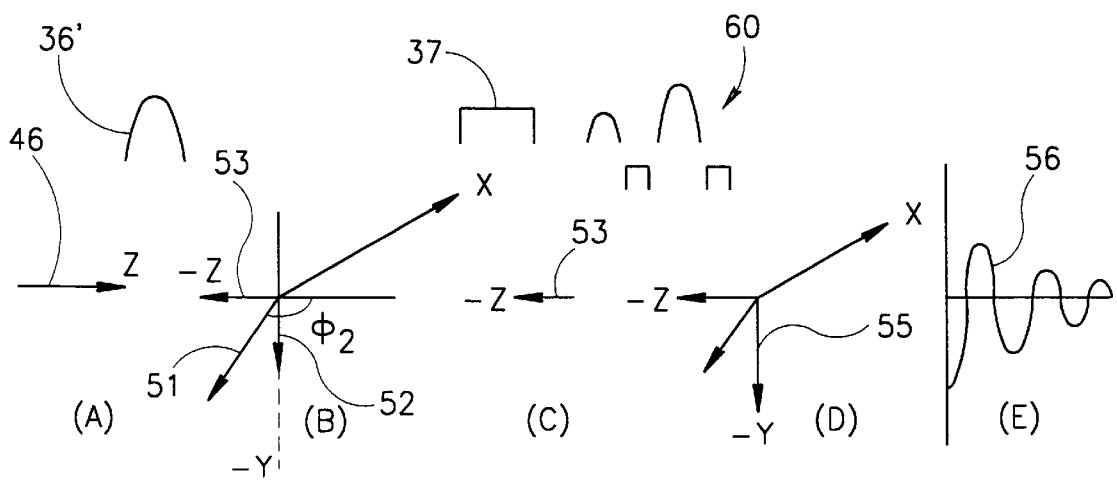
FIG. 5 is a vector diagram showing what occurs when the RF pulse being calibrated provides a tip angle above 90°.

FIG. 5 is a showing of the tipping of the spins responsive to a suppression pulse that is over 90°. FIG. 5 again starts with the spins in the patient in the magnet aligned along the Z axis as shown at 46 (FIG. 5A) the alignment is responsive to the patient being within the magnet having a large static magnetic field in the Z direction. A suppression pulse 36' is applied and if it is over 90°; then, the spins are tipped from the Z direction by an angle of $Ø_2$ which is greater than 90°. The tipped spins are shown at 51 (FIG. 5B). There is a component of the spins 52 in the X-Y plane. A component of the tipped spins is shown at 53 in the negative portion of the Z axis. The spoiler pulse 37 is then applied and it spoils the magnetization in the X-Y plane leaving the magnetization shown at 53 (FIG. 5C) in the minus Z direction. Subsequently, the SE excitation sequence 60 is applied. The result as shown at FIG. 5D is that the spins have a negative component 55 in the X-Y plane. The vector 55 of the shifted spins provides the SE signal shown at 56 (FIG. 5E). The signal is processed to provide the phase angle in the same manner as described above with respect to FIG. 4.

It should be understood that while SE signals are described, other types of signals such as double SE, Gradient Echo (GE) or Free Induction Decay (FID) signals could be used. Also while suppression pulses that tip the slices less than 90° are described as being used to start the sequences; suppression pulses which tip the spins more than 90° could be used to start the sequence and the subsequent pulses could have lower magnitudes. In addition as described herein positive and negative designations are arbitrary; but do designate opposite polarities.

When an FID signal is used then only the RF pulse 38 of the sequence of FIG. 2 is used. The signal 43 is the FID signal acquired right after the RF pulse 38. Preferably a sampling gradient 44 is used during the acquisition of the signal. When the RF pulse causes the phase of the signal 43 to change signs then the applied pulse was larger than necessary to tip the spins 90°. Further pulses are applied to bracket the desired RF pulse magnitude.

It should be understood that while the invention has been described utilizing a preferred embodiment of the invention which measures the phase of a signal, a major innovation of some aspects of the invention is in the determination of whether an RF pulse is larger than or less than the desired power to tip the spins through a required angle. The determination uses the sign of the signal phase of the tipped residual Z directed magnetization. When the tip angle is 90° a phase jump will occur. The use of a particular sequence, or of particular pulses within a sequence has as their goal the emphasis of the change in phase of the signal resulting from the excitation by RF pulses of the residual Z-directed magnetization.

While only certain preferred features of the invention have been illustrated and described many modifications and changes will occur to those skilled in the art. It is therefore to be understood that the appended claims are intended to cover all the modifications and changes that follow within the true spirit of the invention.

We claim:

1. A method for determining the magnitude of an RF pulse for tipping spins, in a material aligned in a magnetic field, in a given direction in a magnetic resonance system by a predetermined amount, the method comprising:

(a) applying a test RF pulse having a given magnitude;

(b) determining the sign of a signal caused by a component of the spins tipped in the given direction responsive to said RF test pulse;

(c) repeating (a) and (b) for a plurality of RF pulses having different powers, at least of one of said RF pulses resulting in said signal having a sign opposite of the sign of the signal caused by at least one other pulse.

2. A method according to claim 1 and including:

determining the magnitude of an RF pulse resulting in zero spin in the given direction from the repeated applications of (a) and (b).

3. A method according to claim 1 wherein the sign of the signal caused by the component of the spin tipped in the given direction is determined from a signal received from the material after application of the RF pulse to the material.

4. A method according to claim 3 and including repeating (c) to determine a transition between the signs of the signals caused by the component of the spins in the given direction.

5. A method according to claim 4 wherein determining the sign of the signal caused by the component of the spins tipped in the given direction comprises determining the phase of the signal.

6. A method according to claim 4 wherein the signal undergoes a phased transition as the spins are tipped to pass through 90°.

7. A method for determining the magnitude of an RF pulse for tipping spins in a material aligned with a magnetic field in a given direction in a magnetic resonance system by a predetermined amount, the method comprising:

(a) applying a test RF pulse having a given magnitude;

(b) receiving a signal having a phase from the material, which signal is responsive to the RF pulse;

(c) determining the phase of the signal;

(d) repeating (a)–(c) for a plurality of RF pulses having different powers, at least one of the RF pulses resulting in a signal having a phase transition compared to the phase of a previously received signal.

8. A method according to claim 7 wherein the phase transition occurs at approximately 180°.

9. A method according to claim 7 for determining the magnitude of an RF pulse for tipping spins in a material aligned with a magnetic field in a given direction in a magnetic resonance system by a desired amount that is different than 90°, the method comprising:

determining the magnitude of an RF pulse which tips spins by 90°; and determining a different magnitude of the RF pulse required for tipping spins by the desired amount from the determined magnitude for tipping the spins by 90°.

10. A method according to claim 1, wherein the predetermined amount is 90°.

11. A method according to claim 3 and including:

suppressing signals generated by components of the spin in directions perpendicular to the given direction.

12. A method according to claim 3 wherein the signal is generated using an SE sequence.

13. A method according to claim 3 wherein the signal is generated using a double SE sequence.

14. A method according to claim 3 wherein the signal is an FID signal.

15. A method according to claim 3 wherein the signal is generated using a Gradient Echo sequence.

16. A method of determining the magnitude of an RF pulse necessary to tip spins aligned with a magnetic field in an object located in the magnetic field of a magnetic resonance system, said method including:

suppressing magnetization of all spins except for residual ones of the spins that are aligned with the magnetic field, acquiring signals by exciting said residual ones of the spins with RF pulses of different magnitudes, and determining the magnitude of the RF pulse that first causes a 180° phase shift in the acquired signals.

17. The method of claim 16 including repeatedly applying RF pulses of different magnitudes to find the RF pulse of a magnitude sufficiently close to the magnitude required to suppress all of the residual ones of the spins that are aligned with the magnetic field.

18. A method for calibrating the RF pulses of a magnetic resonance system, said method comprising:

a) placing an object in a large static magnetic field to align spins in the object with the large static magnetic field, b) applying an RF pulse to be calibrated to rotate the spins through a tip angle of less than 90°, c) increasing the magnitude of the RF pulse until the tip angle is more than 90°, and d) decreasing the magnitude of the RF pulse if the tip angle is greater than 90° until the tip angle is less than 90°.

19. The method of claim 18 wherein determining whether a tip angle obtained from tipped spins by an RF pulse applied to an object in a magnetic field of an magnetic resonance system is more or less than 90°, comprises:

a) exciting spins which remain aligned with the magnetic field after application of an RF pulse to be calibrated, b) sampling a signal from said excited spins, c) determining the phase angle of the sampled signal to determine if the phase angle of excited spins is positive or negative, and d) repeatedly performing a) through c) with sequentially different RF pulses applied to the spins aligned with the magnetic field until the phase angle of the signal changes from positive to negative.

20. The method of claim 19 wherein repeatedly performing a) through c) of claim 1 requires waiting a sufficient time for the excited spins to return to being positively aligned.

21. The method of claim 20 including shortening the time required for the excited spins to return to being positively aligned by causing the spins in the object to be in a steady state condition.

22. A method for calibrating an RF pulse to determine the magnitude of the RF pulse to be used to tip spins that are along the direction of the magnetic field in an MR system by 90°, when said spins are tipped less than 90° some of the spins remain aligned in the direction of the magnetic field, and when the spins have been tipped more than 90° some of the spins remain aligned in a direction opposite to the magnetic field, the calibrating method comprising:

a) placing an object in a large static magnetic field to align spins in the object in the direction of the large static magnetic field, b) applying an RF pulse to be calibrated at a magnitude less than sufficient to tip the spins 90° to the static magnetic field;

c) acquiring a signal from the spins that remain in the direction of the magnetic field, said acquired signal having a phase angle, d) determining if the phase angle is positive or negative, e) applying RF pulses of increasingly greater magnitude if the phase angle was positive until the phase angle becomes negative, and f) using the magnitude of the RF excitation pulse that caused the phase angle to change signs as the calibrated RF pulse for obtaining a 90° tip angle.

23. The method of claim 22 including refining the calibration of the RF pulse.

24. The method of claim 23 wherein refining the calibration of the RF pulse comprises:

a) applying a first half way RF pulse of a magnitude that is half way between the magnitude of the last RF pulse that did not cause the change of the sign of the phase angle and the RF pulse that caused the change of the sign, b) determining if the half way RF pulse changes the sign of the phase angle, c) applying a second half way RF pulse of a magnitude half way between the first half way RF pulse and the last RF pulse that caused the phase angle to change signs if there was no change in sign using the first half way RF pulse, d) applying a second half way pulse of a magnitude half way between the last RF pulse that did not cause the phase angle to change signs and the first half way pulse if there was a change of sign using the first half way RF pulse, e) continuing to apply sequentially different halfway RF pulses until the sign of the phase angle changes, and f) continuing to apply different half way RF pulses until the calibrated pulse is sufficiently close to tipping enough of the spins as required for the purpose intended.

* * * * *